(12) United States Patent
Selvamanickam

(10) Patent No.: US 11,380,462 B2
(45) Date of Patent: *Jul. 5, 2022

(54) SUPERCONDUCTING ARTICLE WITH COMPLIANT LAYERS

(71) Applicant: University of Houston System, Houston, TX (US)

(72) Inventor: Venkat Selvamanickam, Houston, TX (US)

(73) Assignee: University of Houston System, Houston, TX (US)

(*) Notice: Subject to any disclaimer, the term of this patent is extended or adjusted under 35 U.S.C. 154(b) by 9 days.

This patent is subject to a terminal disclaimer.

(21) Appl. No.: 16/116,370

(22) Filed: Aug. 29, 2018

(65) Prior Publication Data

US 2018/0358154 A1 Dec. 13, 2018

Related U.S. Application Data

(63) Continuation of application No. 13/934,974, filed on Jul. 3, 2013, now Pat. No. 10,068,688.

(60) Provisional application No. 61/668,137, filed on Jul. 5, 2012.

(51) Int. Cl.
*H01B 12/06* (2006.01)
*H01L 39/24* (2006.01)

(52) U.S. Cl.
CPC ......... *H01B 12/06* (2013.01); *H01L 39/2461* (2013.01)

(58) Field of Classification Search
CPC .................... H01B 12/06; H01L 39/2461
See application file for complete search history.

(56) References Cited

U.S. PATENT DOCUMENTS

| | | | |
|---|---|---|---|
| H2066 H * | 6/2003 | Cukauskas | 428/141 |
| 10,068,688 B2 * | 9/2018 | Selvamanickam | H01L 39/2461 |
| 2002/0119893 A1 * | 8/2002 | Hughes | C30B 23/02 505/300 |
| 2002/0144838 A1 | 10/2002 | Fritzemeier et al. | |
| 2005/0159298 A1 * | 7/2005 | Rupich | H01L 39/2425 502/100 |
| 2005/0255680 A1 | 11/2005 | Rokhvarger et al. | |
| 2006/0258539 A1 * | 11/2006 | Matsumoto | C23C 14/02 505/100 |
| 2007/0111893 A1 | 5/2007 | Kodenkandath et al. | |
| 2007/0249841 A1 * | 10/2007 | Backer | H01L 39/2483 548/203 |
| 2008/0153709 A1 | 6/2008 | Rupich et al. | |
| 2009/0233800 A1 * | 9/2009 | Huang | H01L 39/247 505/237 |
| 2011/0245083 A1 | 10/2011 | Sathyamurthy et al. | |

(Continued)

OTHER PUBLICATIONS

Crisan et al. "Sputtered nanodots: A costless method for inducing effective pinning centers in superconducting thin films." Applied physics letters. vol. 79, No. 27. Dec. 31, 2001. (Year: 2001).*

(Continued)

*Primary Examiner* — Paul A Wartalowicz
(74) *Attorney, Agent, or Firm* — Blank Rome LLP; Matthew J. Esserman (57) ABSTRACT

A composition for a plurality of configurations of a high-temperature superconductor tape including a superconducting film disposed on a compliant film or sandwiched or captured between at least one pair of compliant film layers.

4 Claims, 8 Drawing Sheets

(a)

(b)

(56) References Cited

U.S. PATENT DOCUMENTS

| | | | |
|---|---|---|---|
| 2012/0015814 A1* | 1/2012 | Usoskin | H01L 39/126 505/150 |
| 2012/0031644 A1 | 2/2012 | Maxwell et al. | |
| 2013/0240874 A1* | 9/2013 | Maekawa | H01L 29/66136 257/43 |
| 2014/0038829 A1* | 2/2014 | Hanafusa | H01L 39/2422 505/237 |
| 2015/0105261 A1* | 4/2015 | Nagaishi | H01B 12/06 505/124 |

OTHER PUBLICATIONS

International Search Report and Written Opinion received in PCT Application No. PCT/US2013/049301, dated Sep. 27, 2013.

Carr, W. J., Jr., "Filamentary YBCO Conductors for AC Applications," IEEE Transactions on Applied Superconductivity, vol. 9, No. 2, Jun. 1999, 4 pages.

Goyal, et al., "High critical current density superconducting tapes by epitaxial deposition of YBa2Cu3Ox thick films on biaxially textured metals," Appl. Phys. Lett. 69 (12), Sep. 16, 1996, 3 pages.

Iijima, et al., "Biaxially Aligned YBa2Cu3O7-x Thin Film Tapes," Physica C 185-189, 1991, 2 pages.

Selvamanickam, "High Performance 2G Wires: From R&D to Pilot-Scale Manufacturing," IEEE Transactions on Applied Superconductivity, vol. 19, No. 3, Jun. 2009, 6 pages.

Van der Laan, et al., "Delamination strength of YBCO coated conductors under transverse tensile stress," Supercond. Sci. Technol. 20, 2007, 6 pages.

Wu, et al., "Properties of YBa2Cu3O7-6 thick films on flexible buffered metallic substrates," Appl. Phys. Lett. 67 (16), Oct. 16, 1995, 3 pages.

Yanagisawa, et al., "Remarkable weakness against cleavage stress for YBCO-coated conductors and its effect on the YBCO coil performance," Physica C 471, 2011, 32 pages.

\* cited by examiner

SUPERCONDUCTING ARTICLE WITH COMPLIANT LAYERS

CROSS-REFERENCE TO RELATED APPLICATIONS

This application is a Continuation of U.S. patent application Ser. No. 13/934,974, filed Jul. 3, 2013, issuing on Sep. 4, 2018 as U.S. Pat. No. 10,068,688, which claims priority to U.S. Provisional Patent Application No. 61/668,137, filed Jul. 5, 2012, both of which are hereby incorporated herein by reference in their entireties.

STATEMENT REGARDING FEDERALLY SPONSORED RESEARCH OR DEVELOPMENT

Not applicable.

BACKGROUND

Field of the Disclosure

This disclosure relates to superconductors and more specifically to the mechanical and electrical properties of superconducting tapes.

Background of the Disclosure

Several materials and systems have been researched in order to solve the future problems with energy generation, transmission, conversion, storage, and use. Among many potential solutions, superconductors may represent a unique system solution across a broad spectrum of energy problems. More specifically, superconducting structures, including high-temperature superconducting (HTS) tapes, enable high efficiencies in generators, power transmission cables, motors, transformers and energy storage. Further, superconductors may have applications beyond energy to medicine, particle physics, communications, and transportation.

Conventionally, there are about nine components in a typical second-generation high-temperature superconducting (2G HTS) tape. The architecture consists of several oxide films on a metallic substrate and capped with silver and copper over-layers. The composite structure is prone to issues such as debonding between individual layers and delamination within the superconductor layer. Transverse tensile strength measurements on some conventional 2G HTS tapes, wherein a tensile stress is applied normal to the tape's surface, have shown evidence of weakness. A uniform pull or stress may be imparted on the tape by means of Lorentz force acting mutually perpendicular to a transport current flowing through a superconducting tape in conjunction with an externally applied magnetic field. The fracture surfaces of the 2G HTS tape provide insight into the interfaces and films architecture or structures that are prone to debonding and delamination. More specifically, the interface between the $LaMnO_3$ (LMO) top buffer layer and the $REBa_2Cu_3O_x$ (REBCO) superconducting film has been found to be prone to debonding and the REBCO itself has been observed to be prone to delamination within the overall architecture of the HTS tape.

Additionally, evidence of weak transverse strength in tapes in coils fabricated with epoxy impregnation has been observed. The difference in thermal expansion coefficients of the tape and epoxy may result in the transverse stress on the tape. Thus, if the tolerance of the tape to this stress is low, then coil degradation may occur. Further, as a significant proportion of the applications of 2G HTS tape involve coil geometries, this mechanical weakness poses a significant problem in the deployment of 2G HTS tapes to these industries. Another source of weakness within the REBCO film structures is the presence of secondary phases, such as copper-oxide (CuO) and misoriented a-axis grains. These inhomogeneities in the microstructure provide crack propagation paths that may result in reduced transverse tensile strength, as well as decreased current carrying capacity, or critical current, of the superconductor, and may be detrimental to other electrical properties. Thus, there is a demand for a HTS tape having improved transverse tensile strength and electrical properties for commercial applications.

BRIEF SUMMARY

Disclosed herein is a high temperature superconducting tape architecture with a plurality of configurations to improve the mechanical and electrical properties therein. More specifically, in one exemplary configuration, the HTS tape includes the superconducting film sandwiched or captured between a compliant film and the overlayer. Additionally, another exemplary configuration comprises a superconducting film deposited on a composite of oxide and a compliant material. Additionally, an extrapolation of this configuration may include alternating layers of superconductor films with compliant material. Further, the superconducting film deposited on LMO, or other oxide buffer surface, with an array of nanoparticles of a compliant material is disclosed herein. In other exemplary configurations, the superconducting film may include randomly distributed, compliant particles, or include an embedded layer of compliant nanomaterials, and in certain instance, the tape may comprise multiple layers thereof.

Further, there is disclosed one configuration of a superconductor tape structure comprising a substrate, compliant material layer, a superconducting layer overlying the compliant material layer, and an overlayer. The compliant material layer may comprise an epitaxially or biaxially oriented layer and at least one material chosen from the group consisting of metals, alloys, ceramics, and combinations thereof. Further, the compliant material may comprise a high ductility or a high fracture toughness, such as but not limited to a composite of an oxide and a metal or alloy, such as but not limited to silver.

Also, there is disclosed a superconducting tape comprising a substrate, a first superconducting layer, a compliant material array, a second superconducting layer, and an overlayer. In exemplary configurations, the compliant material array comprises nanoparticles having a size of less than about 0.5 µm disposed between the first superconducting layer and the second superconducting layer. In some configurations, the superconducting tape structure comprises a substrate, a plurality of superconducting layers, a plurality of compliant material layers, wherein at least one of the plurality of the compliant material layers covers at least 15% of the surface area of the layer beneath it. Further, in some configurations, at least one of the compliant material layers comprises at least one epitaxially oriented layer.

In another configuration, a superconductor structure comprises a substrate, a compliant material array comprising nanoparticles having a size of less than about 0.5 µm, a superconducting layer, and an overlayer. In some instances, the compliant material array comprises at least one material chosen from the group consisting of metals, alloys, ceramics, and combinations thereof, having a high ductility or high fracture toughness, and covering at least 15% of the surface area of the layer beneath it. In certain instances, the compliant material comprises silver.

Also disclosed a superconductor structure comprising a substrate, a first superconducting layer, a compliant material layer, a second superconducting layer, and an overlayer. In certain configurations, each of the first and the second superconducting layer has a thickness of less than about 1 μm. Further, the compliant material layer may be disposed between the two superconducting layers. In some configurations, the compliant material layer comprises a biaxial textured material chosen from the group consisting of metals, alloys, ceramics, and combinations thereof.

The embodiments described herein comprise a combination of characteristics and features intended to address various shortcomings associated with certain prior compositions, combinations and devices. The various characteristics and features described above, as well as others, will be readily apparent to those skilled in the art upon reading the following detailed description and by referring to the accompanying drawings.

BRIEF DESCRIPTION OF THE DRAWINGS

For a detailed description of the exemplary configurations of the disclosure, reference will now be made to the accompanying drawings in which.

DETAILED DESCRIPTION

Figure 1:
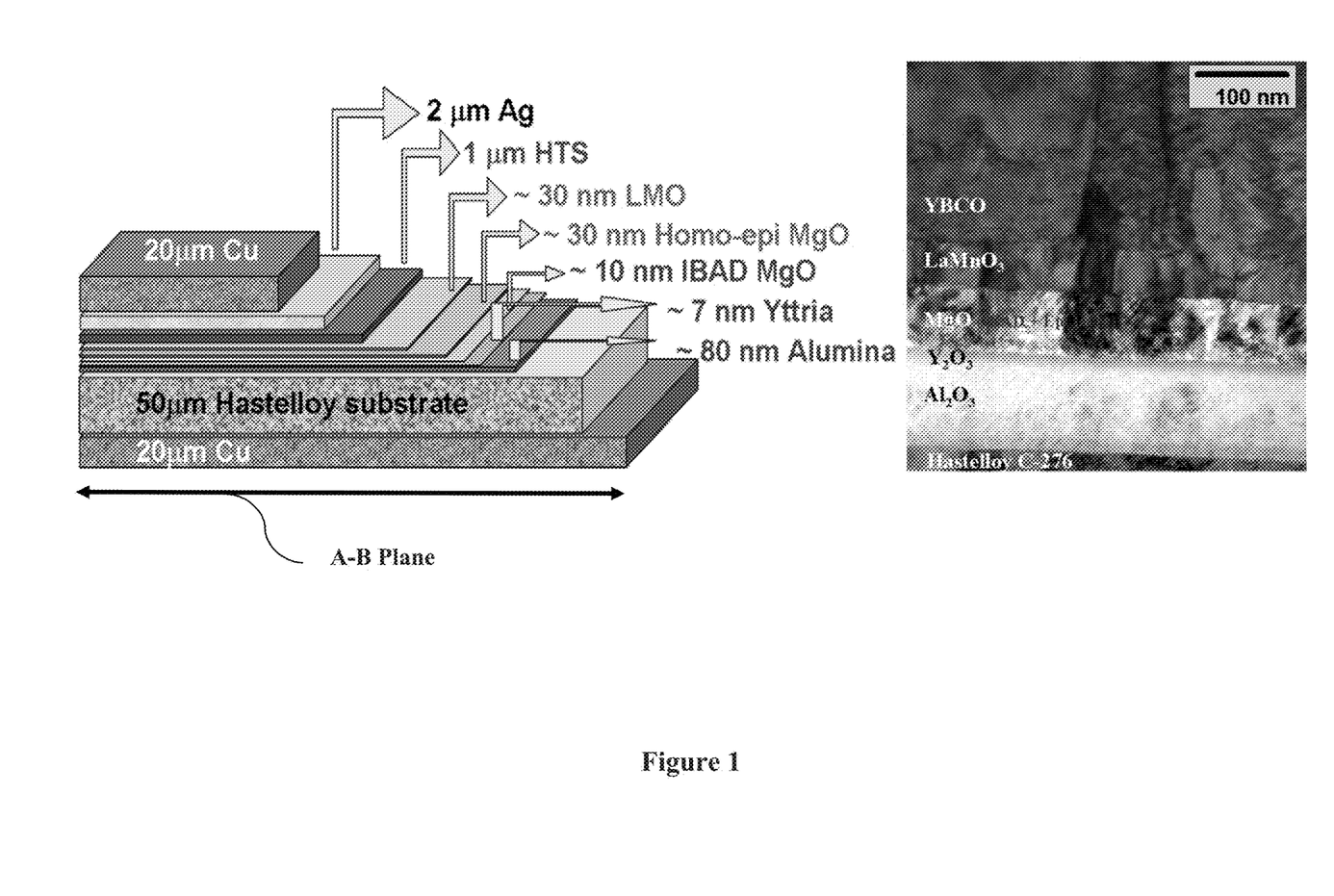
FIG. 1 illustrates a schematic cross-sectional microstructure of a conventional thin film superconducting tape adjacent to a photomicrograph thereof.

As shown in FIG. 1, there are typically about nine components in a conventional 2G HTS tape. The architecture consists of several oxide films on a metallic substrate and capped with silver and copper overlayers. Generally, the composite structure is prone to de-bonding between individual layers and delamination within the superconducting layer. 2G HTS demonstrate these potential weaknesses wherein a tensile stress is applied normal to the tape's surface for example, when a uniform pull is imparted on the tape by means of Lorentz force acting mutually perpendicular to both a transport current flowing through a superconducting tape and an externally applied magnetic field. During these tests, the fracture surfaces of the 2G HTS tape reveal the interfaces and films that may exhibit high frequencies of debonding and delamination.

Figure 2:
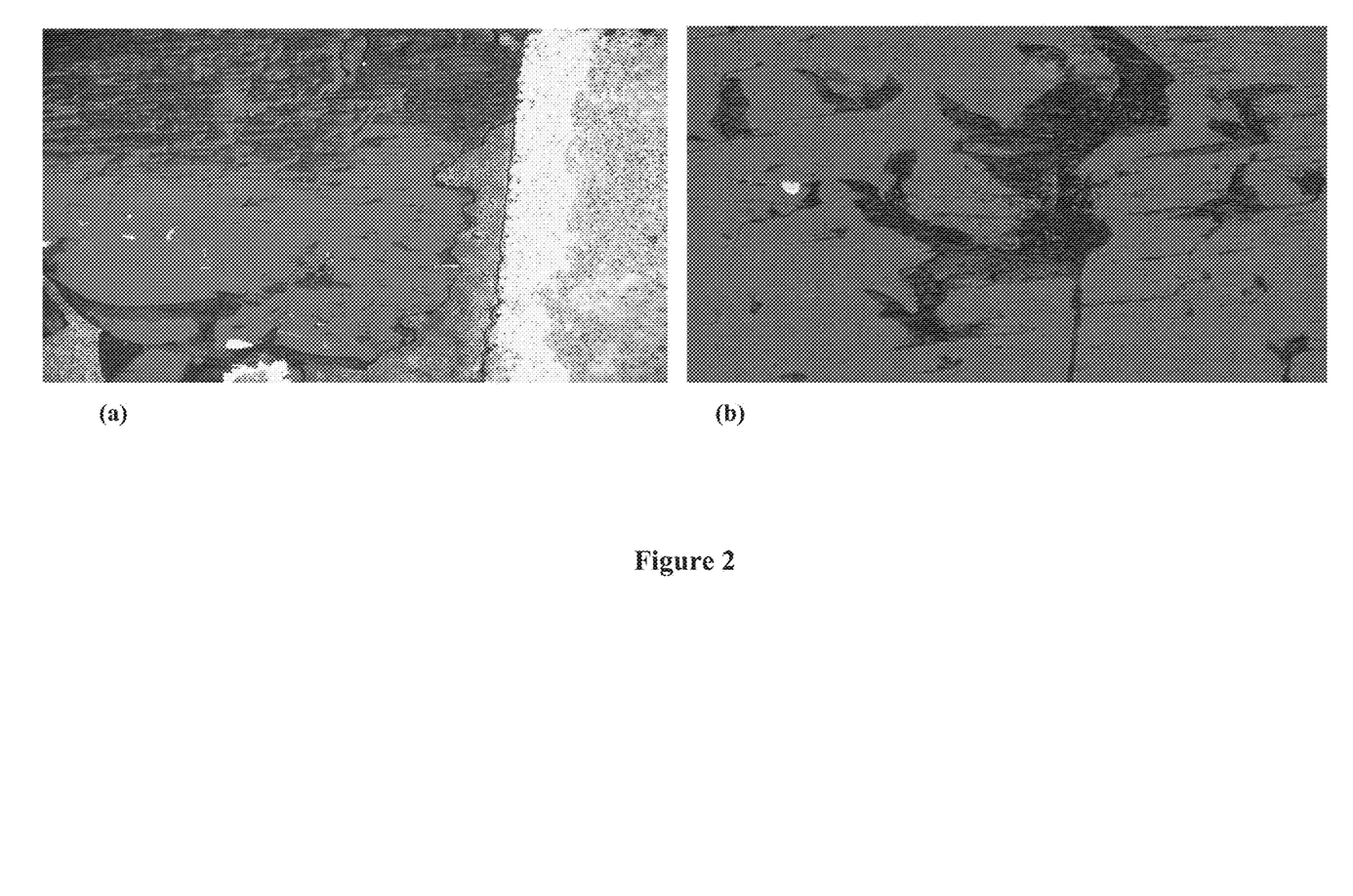
FIG. 2 illustrates the two examples of the fracture surfaces of a conventional superconducting tape after debonding and delamination during testing at high transport current and high magnetic field, the light regions are the top buffer layer and dark regions are the exposed superconducting layer.

Referring now to FIG. 2, the photomicrograph illustrates examples of the fracture surfaces resultant from debonding and delamination of a conventional tape. FIG. 2 specifically illustrates that the interface between the $LaMnO_3$ (LMO) top buffer layer and the $REBa_2Cu_3O_x$ (REBCO) superconducting film is prone to debonding under these transverse stresses. Meanwhile, the REBCO itself is prone to delamination within the layer as shown in the FIG. 2. Additionally, it is known that coils fabricated with epoxy impregnation are poorly resistant to transverse stresses. Specifically, the thermal expansion coefficient differences between the tape and the epoxy may result in sufficient transverse stress on the tape causing it to debond or delaminate. Further, if the tolerance of the tape to this degradation is low, then coil degradation occurs. Generally, the expected 2G HTS tape applications involve coil geometries, and this mechanical weakness poses a significant barrier to the implementation and deployment of 2G HTS tapes commercially.

Figure 3:
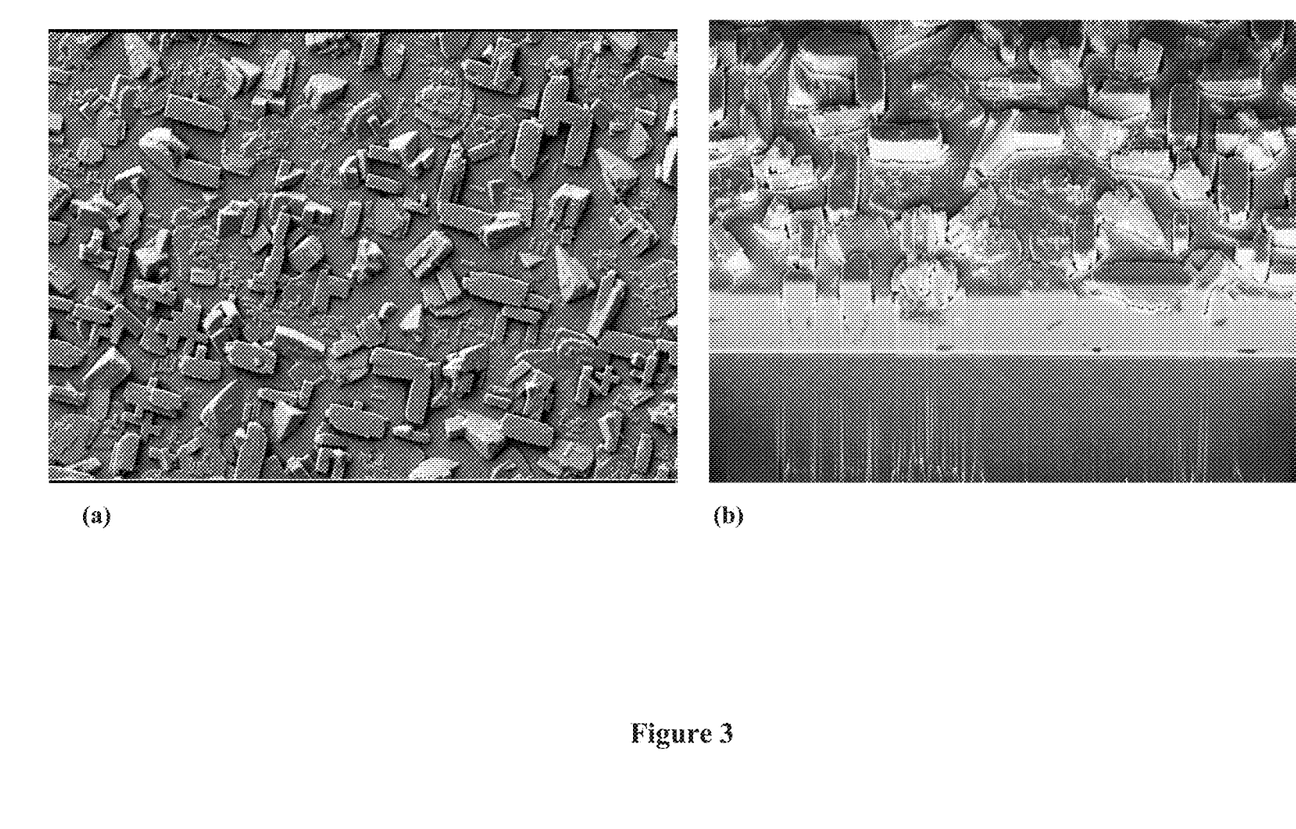
FIG. 3 illustrates the (a) top-surface and (b) cross-section of an exemplary super-conducting film on Ion Beam Assisted Deposition (IBAD) MgO template on flexible metal substrate, with a thickness of about 2 μm.

Disclosed herein is a novel HTS architecture intended to improve the transverse tensile strength of 2G HTS tape. As discussed herein, one source of weakness within the REBCO film is the presence of secondary phases such as CuO and misoriented a-axis grains. For example, referring to FIG. 3, the microstructure of the top surface and cross section of a 2 μm thick REBCO film in a 2G HTS tape shows an abundance of a-axis grains (a) and CuO (b). These inhomogeneities in the microstructure could provide paths of crack propagation resulting in reduced transverse tensile strength and reduction in the electrical properties of an HTS tape, in particular, the current carrying capacity, or critical current, of the superconductor.

Thus, the disclosure herein includes a plurality of configurations of a high-temperature superconductor (HTS) tape designed to improve the mechanical and electrical properties therein. More specifically, in one exemplary configuration the HTS tape includes the superconducting film sandwiched or captured between a compliant film and the overlayer, for example a silver overlayer. In instances, the overlayer serves to protect the superconducting film from the environment. Additionally, another exemplary configuration comprises a superconducting film deposited on a composite of oxide and a compliant material. Further, an extrapolation of this configuration may include alternating films of superconductor films with compliant material. Further, the superconducting film deposited on LMO, or other oxide buffer surface, with an array of nanoparticles of a compliant material is disclosed herein. In other exemplary configurations disclosed herein, the superconducting film may include randomly-distributed, compliant particles, or include an embedded layer of compliant material comprising nanoparticles, and in certain instances, the tape may comprise multiple layers thereof.

In certain instances, the present disclosure is related to forming an HTS tape having a compliant material component therein. As used herein, a compliant material is any that is ductile, exhibits high fracture toughness, resistance to brittle failure, or some combination thereof. In a non-limiting example, a compliant material disclosed herein may be silver. It may be noted that multi-micron-sized and larger silver particles may be used in bulk superconductors and in thin films, but to-date, the configurations of the 2G HTS tapes herein have not been described. Also, other metals and alloys that are compatible with the superconductor may be incorporated into the configurations disclosed herein; such as, but not limited to, ceramics including aluminum oxide, yttria-stabilized zirconia, and titanium-nitride.

In one configuration mentioned hereinabove, a superconducting film is captured or sandwiched between compliant films. Generally, the compliant films cover at least about 15% of the area of the preceding layer, for example, the layer below the compliant film. Still further, the compliant films cover at least about 20% of the area of the layer therebelow; and in certain configurations, the compliant films cover at least about 25% of the layer beneath it. In some configurations, the compliant films may include a metal, an alloy, a ceramic, or a composite thereof. In certain configurations, the metal, alloy, or ceramic may comprise an oxide. Without limitation by any particular theory, the compliant layer comprises a material with a high ductility, a high fracture toughness, or a combination thereof. In exemplary configurations, the compliant layer comprises a metal such as but not limited to silver or an alloy thereof, disposed on the substrate. The superconducting layer is deposited thereon, for instance by a metal organic chemical vapor deposition process (MOCVD). In other exemplary configurations, the superconductor layer is deposited on a substrate and a compliant layer is deposited thereon. In certain configurations, the substrate comprises a continuous epitaxial thin film of a compliant film, such as silver. Subsequently, a silver overlayer may be deposited such that the superconductor is captured, partially encapsulated, or "sandwiched" between the silver layers. The superconductor film is contained fully between two compliant or ductile film layers as described to provide the disclosed transverse tensile strength.

Figure 4:
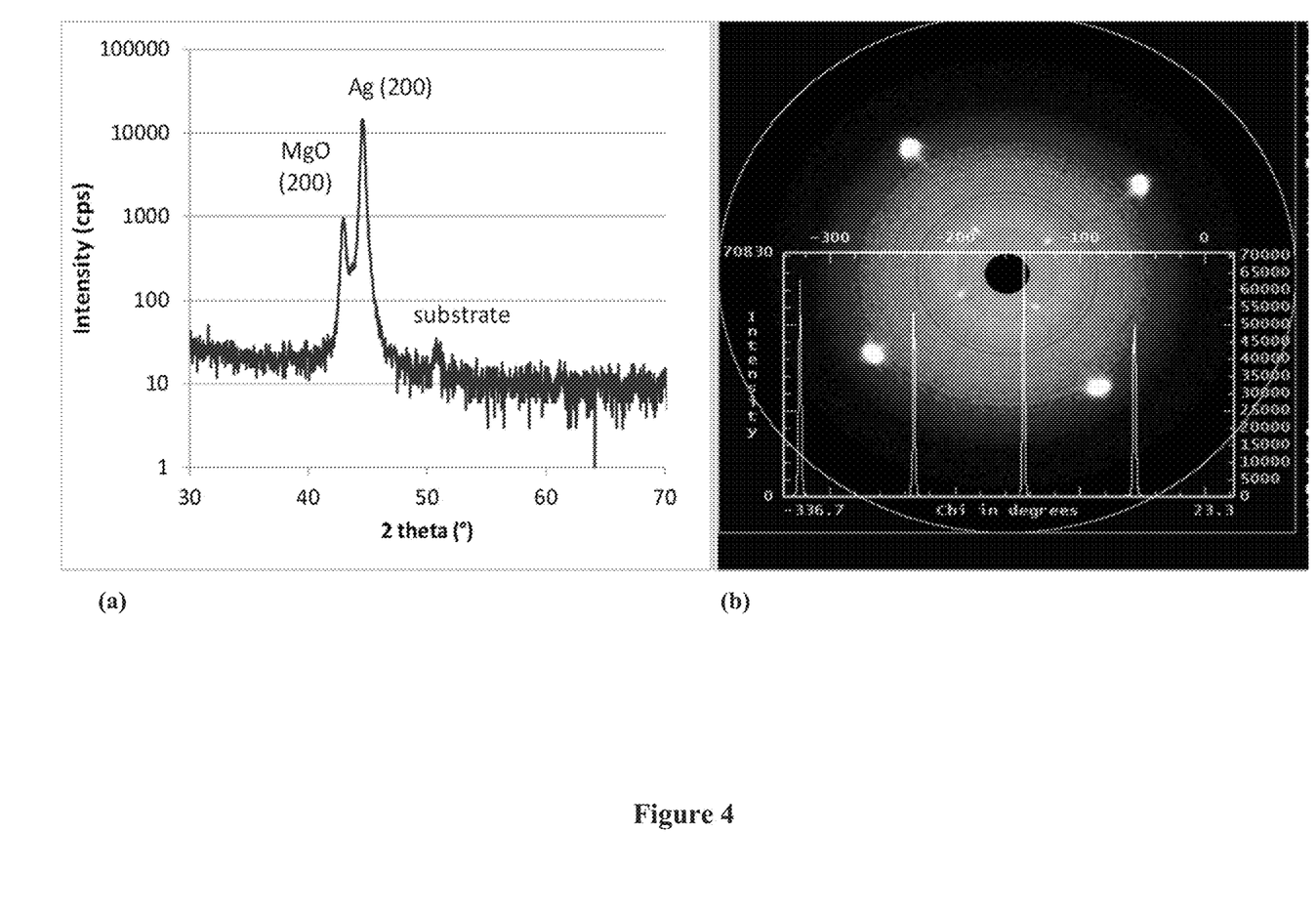
FIG. 4 illustrates the (a) XRD theta/2-theta ($\theta/2\theta$) pattern of Ag buffer epitaxially grown on MgO-buffered metal substrate and (b) XRD pole-figure of the epitaxial Ag buffer.

Further, the compliant film may be deposited on the substrate or entail the epitaxial growth of the compliant film on the substrate, prior to deposition of the superconducting material. The compliant film such as silver or a similarly compliant/ductile film may be grown on a biaxially-textured template to form the substrate. Further, after deposition of the superconducting material, additional layers of compliant film may be grown epitaxially thereon. Thus, this step of epitaxial growth may precede or follow the epitaxial growth of superconducting film. For example, the process of epitaxial growth of silver film on biaxially-textured MgO grown by ion beam assisted deposition on a metal substrate has been successfully demonstrated. Referring now to FIG. 4(a), there is shown the theta-2theta pattern obtained by X-Ray Diffraction (XRD) from an exemplary silver film according to one configuration of the present disclosure. A strongly textured silver orientation along (200) is observed in the Figure and no other orientations of the metal are seen. FIG. 4(b) displays the XRD polefigure (111) of the epitaxial silver film, illustrating the in-plane texture of about 2° full-width, half-maximum (FWHM) has been achieved. Without limitation by any particular theory, the biaxially-textured film enables epitaxial growth of superconducting film in a subsequent process.

In another configuration, the superconducting film is deposited on a compliant material layer that includes a discontinuous array of nanomaterials, the layer comprising a compliant or ductile material or metal, such as but not limited to, silver. In instances, this compliant material layer includes nanomaterial that covers at least about 15% of the area of the preceding layer, for example, the layer below the compliant film. In other instances, the compliant film material includes a discontinuous array of nanomaterial that covers at least about 20% of the area of the layer therebelow; and in certain configurations, the compliant film material includes a discontinuous array of nanomaterial that covers at least about 25% of the layer beneath it. In certain instances, a composite of oxide-silver is deposited epitaxially on a biaxially-textured template. Subsequently, the superconductor film is deposited thereon the compliant material layer having the discontinuous array of nanomaterial. In certain configurations, this may result in improved fracture toughness, for example to the oxide buffer layer, and stronger bonding between the superconductor and the overlayer or substrate layers.

Figure 5:
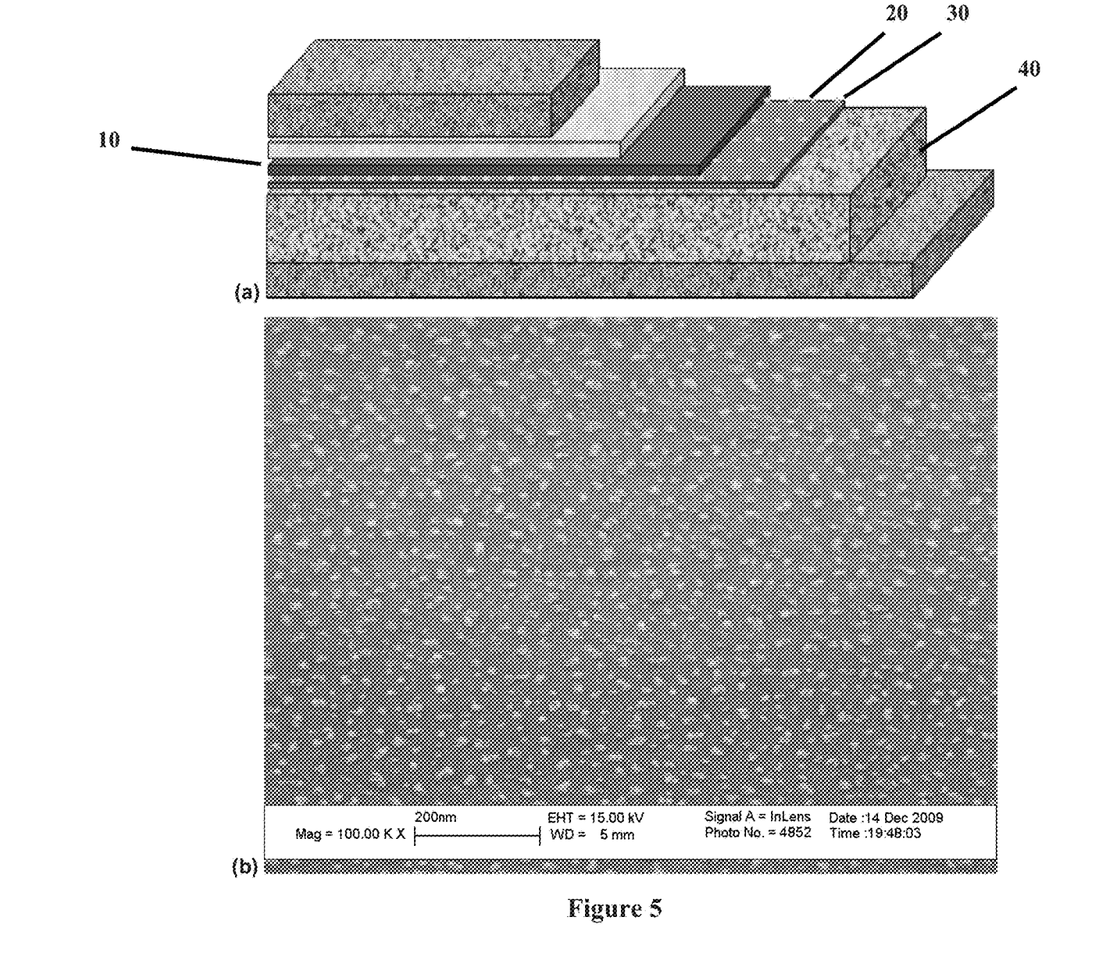
FIG. 5 illustrates (a) a schematic of a compliant material having a discontinuous array of nanoparticles on oxide buffer on which the superconductor film is deposited and (b) the microstructure of a nanoparticle array of silver created on an oxide buffer on IBAD template on metal substrate.

Referring to FIG. 5, the superconductor film 10 is deposited onto the compliant layer, for example the nanomaterial array comprising compliant nanomaterials, and in certain instance, comprising compliant nanoparticles. In instances, the nanomaterials or nanoparticles are ductile, exhibit high fracture toughness, resistance to brittle failure, or some combination thereof. As previously disclosed herein, suitable compliant nanoparticles comprise silver, or other nanomaterials particles having similar properties, without limitation. In certain instances, the nanomaterial array 20 comprises a discontinuous array of nanoparticles. The nanoparticles of the nanomaterial array 20 cover at least about 20% of the area of the layer therebelow; and in certain configurations, the nanoparticles of the nanomaterial array 20 cover at least about 25% of the layer beneath it. The nanomaterial array 20 may be formed by deposition of an incomplete or thin film on the oxide buffer layer 30 followed by deposition of the superconducting layer 10. The thin film does not have to be epitaxial and thus may be deposited on the oxide buffer at a low temperature. More specifically, the nanoparticles are first formed on the oxide buffer layer 30, supported on the substrate 40. As disclosed herein, under conditions wherein the film is incompletely deposited or significantly thin, for example less than about 0.5 µm, the film decomposes or contracts during subsequent heat treatment, into the nanomaterial array 20 comprising a discontinuous array of nanoparticles. Referring to FIG. 5(a) the small dots on the comprising the nanomaterial array 20 represent the nanoparticles that are shown in the photomicrograph found in FIG. 5(b).

Misoriented grains in the superconducting film result from the failure to maintain an optimum temperature during thick film growth. More specifically, when temperature decreases to below about 30° C. below the optimum temperature, the epitaxial growth of the superconducting film is affected, resulting in misoriented or misaligned grains in the superconducting film that reduce critical current density and reduce mechanical strength of the article. In the configurations described above with respect to FIGS. 4 and 5, the distribution of silver particles within the superconducting film provides liquid-phase assisted growth that functions to lower the optimum deposition temperature to a more suitable range to prevent or reduce misoriented grain growth. The superconductor-silver composite could be deposited at a lower optimum temperature, for example between about 20° C. and about 50° C. below the optimum temperature required for a depositing superconductor film without silver. Thus, the misoriented grain growth that is deleterious to electrical and mechanical properties may be avoided.

Figure 6:
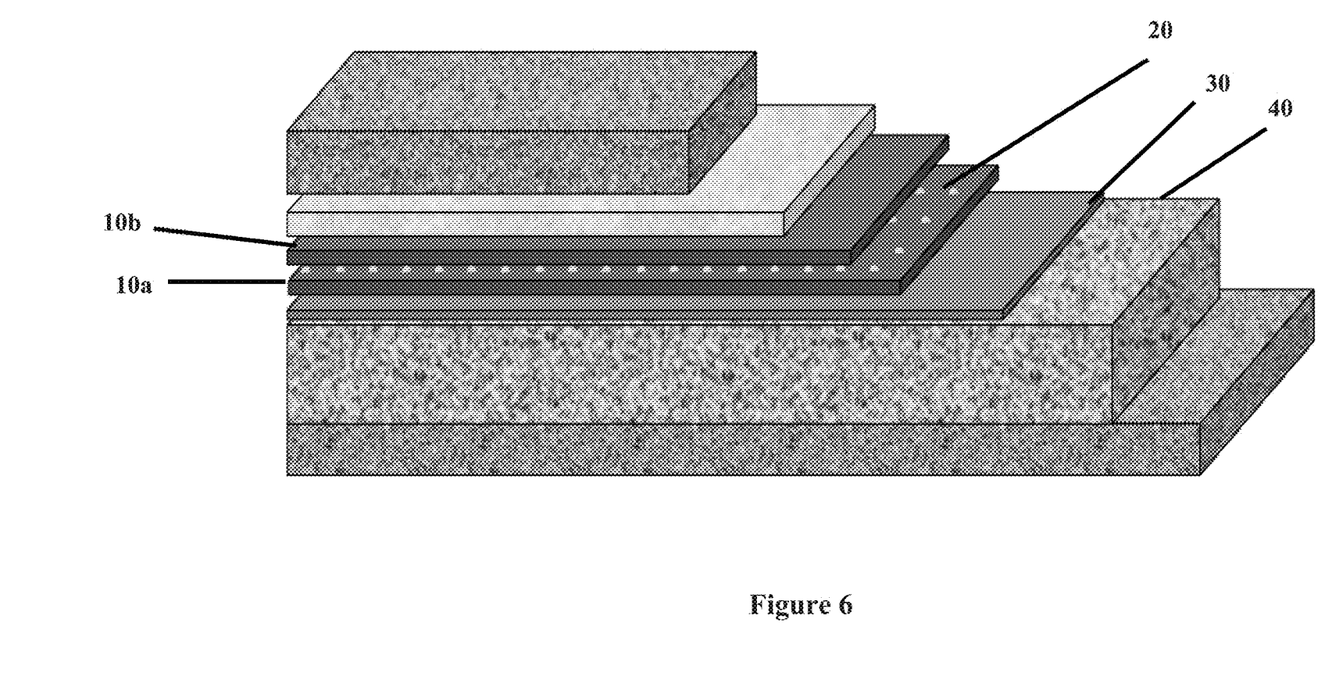
FIG. 6 illustrates a schematic of an exemplary 2G HTS tape architecture having nanoparticle arrays in between layers of superconducting film.
Figure 7:
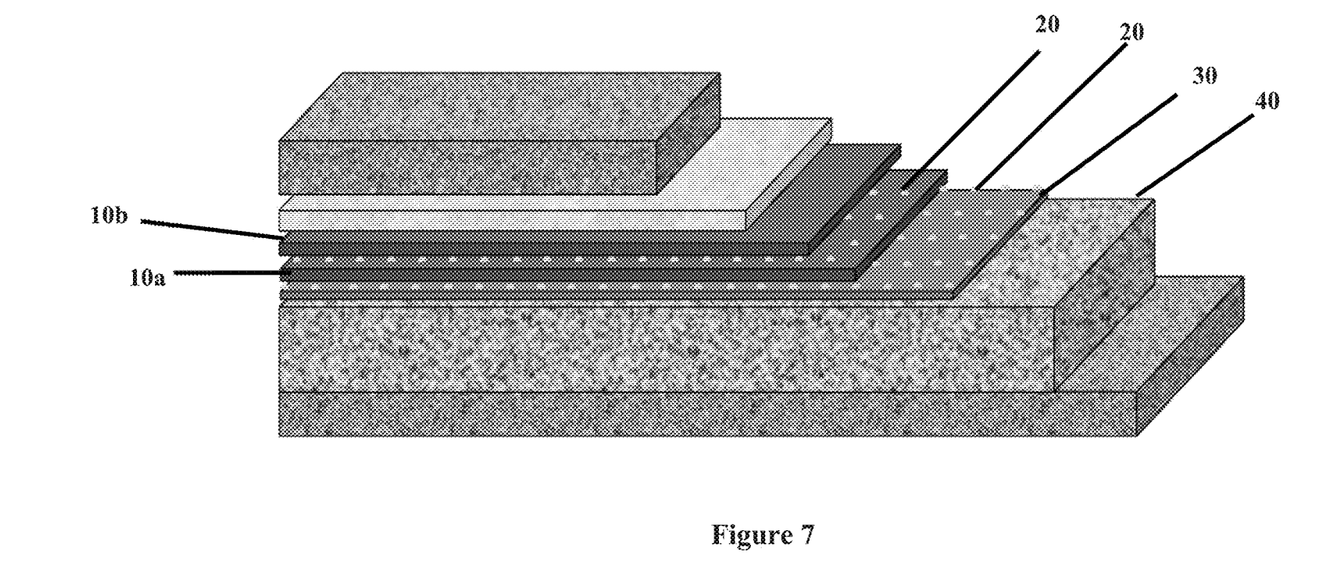
FIG. 7 illustrates a schematic of a 2G HTS tape architecture with compliant material nanoparticle arrays on the oxide buffer surface and within the superconducting film.

Thus, as illustrated in FIG. 6, in another configuration, a film of compliant material that includes a discontinuous array 20 of nanoparticles may be deposited within the superconducting film 10. In instances, similar to the previous descriptions, silver or discontinuous silver and other suitably compliant or ductile metals may be deposited within the superconducting film 10. For example, without limitation, the process may be initiated as described hereinabove to deposit a first superconducting layer 10a on a template or other support for superconductor deposition, such as the buffer layer 30. Subsequently, a significantly thin layer of compliant material, for example silver film having a thickness of less than about 0.5 µm, is deposited on the first layer of superconducting film 10a. The thin film of compliant material self-converts or aggregates into a layer of nanoparticles, forming the nanomaterial array 20. In the present example, the nanoparticles are silver, although any material or alloy described herein is suitable. An additional or second layer of superconducting material 10b may be deposited on the nanomaterial array 20. Thus, an epitaxial film is rendered unnecessary and the second superconductor film is grown directly on the first superconducting film 10a with a nanoparticle covering in the nanomaterial array 20. In the completed structure, the silver nanoparticles are embedded between the two superconducting film layers 10a and 10b, wherein 10a is a first superconducting film layer and 10b is a second superconducting film layer. Furthermore, the process disclosed herein may be repeated multiple times to obtain a configuration comprising alternating superconductor layers 10 and compliant nanomaterial array 20 comprising nanoparticles, for example to obtain a superconductor with several superconducting layers, including more than 5 superconducting layers, as an example. Additionally, this configuration may be combined with that described in FIG. 5 to form a superconducting tape configuration or architecture as illustrated in FIG. 7. In this latter configuration, the nanoparticles of the nanomaterial array 20 impart improved interfacial bonding between the oxide buffer layer 30 and the superconductor layers 10 as well as improved delamination strength of the superconductor in the finished product compared to conventional HTS tapes. Additionally, the silver particles can prevent crack initiation or growth that could propagate within the bulk of the superconducting film when the tape is subjected to a transverse tensile or bending stress.

Figure 8:
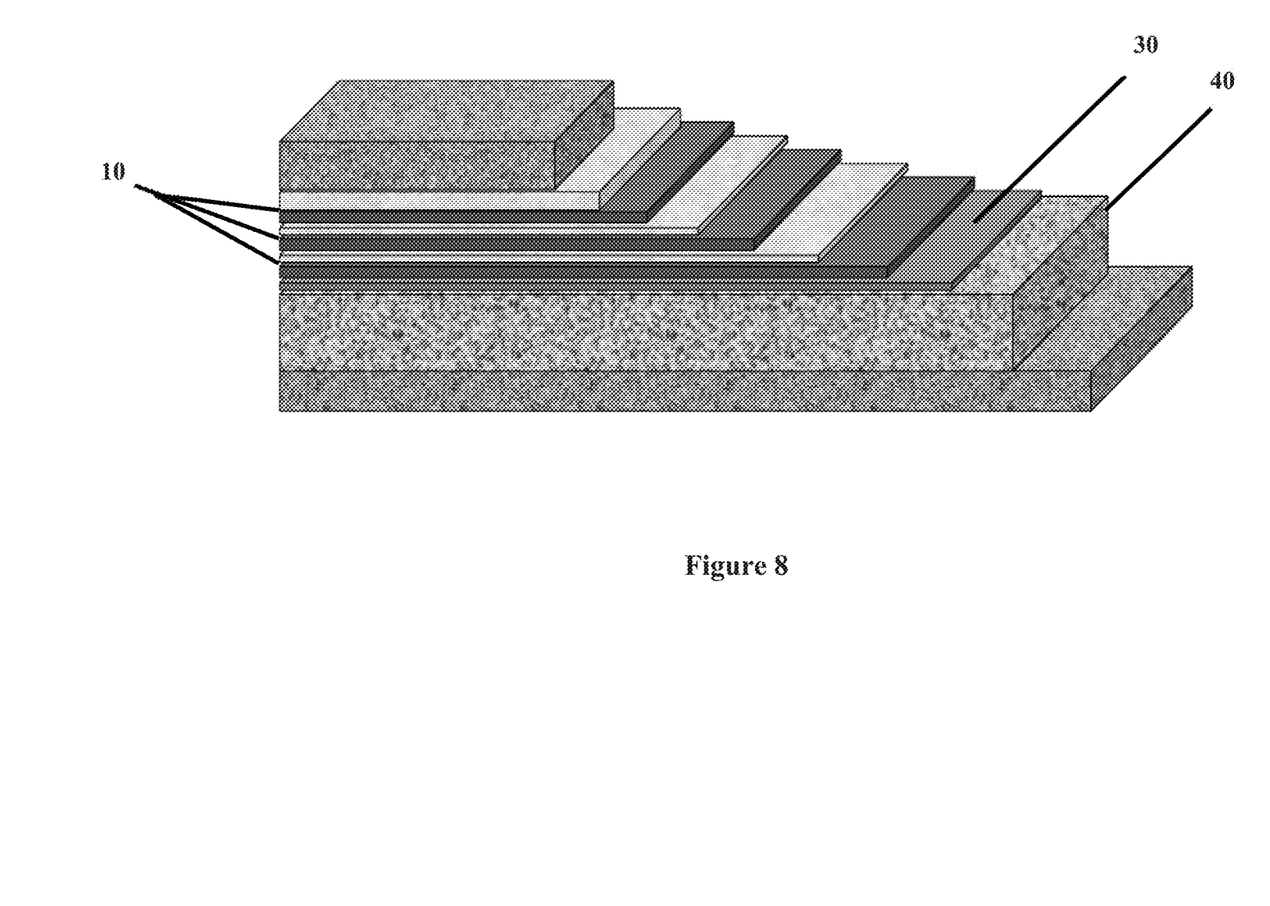
FIG. 8 illustrates schematic of an exemplary 2G HTS tape architecture having alternating superconductor and compliant material films.

Extrapolating the disclosure, the illustration in FIG. 8 further shows that the disclosed process of alternating layers of superconductor 10 and compliant nanomaterials 20 may be applied to compliant material thin films. More specifically, the thin films of compliant nanomaterial 20, for example silver, grown epitaxially as described hereinabove, may be repeated a plurality of times in order to form a stack or stacked "sandwich" of the compliant layers 40 with a superconducting layers 10 between each of the compliant layers 40, to form an plurality of alternating layers. The process to achieve that configuration comprises, in addition to the first epitaxial film on oxide, additional compliant material films that are deposited in an alternating sequence on superconducting films. This configuration may be envisioned as shown in FIG. 8. Further, as there are a plurality of layers of the superconducting film, elimination of the misoriented and misaligned grains is possible within the scope of the present disclosure. By depositing each superconducting film layer in a significantly thin layer, for example, less than about 1 µm, the random growth of misoriented grains seen in thick films of certain conventional superconducting tapes is avoided. Still further, the relatively thin superconducting film layers captured in or sandwiched between compliant film layers results in a configuration or architecture of the HTS tape with improved mechanical properties.

Exemplary embodiments are disclosed herein and variations, combinations, and/or modifications of such embodiment(s) may be made by a person having ordinary skill in the art and are within the scope of the disclosure. Alternative embodiments that result from combining, integrating, and/or omitting features of the expressly-disclosed embodiment(s) are also within the scope of the disclosure. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . 50 percent, 51 percent, 52 percent . . . 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as "comprises", "includes", and "having" means "including but not limited to" and should be understood to also provide support for narrower terms such as "consisting of", "consisting essentially of", and "comprised substantially of." Accordingly, the scope of protection is not limited by the description set out above but is defined by the claims that follow, that scope including all equivalents of the subject matter of the claims. Each and every claim set out below is incorporated into this specification as additional disclosure, and each is an exemplary embodiment of the present invention. All patents, patent applications, and publications cited in this disclosure are hereby incorporated by reference, to the extent that they provide exemplary, procedural or other details supplementary to the disclosure.

I claim:

1. A superconductor structure comprising:
    a substrate;
    a superconducting layer disposed above the substrate; and
    a compliant material layer disposed within the substrate;
    wherein the compliant material layer comprises nanoparticles having a size of less than about 0.5 µm.

2. The superconductor structure of claim 1, wherein the compliant material layer comprises silver.

3. The superconductor structure of claim 1, further comprising an overlayer disposed above the superconducting layer.

4. The superconductor structure of claim 3, wherein the overlayer comprises silver.

\* \* \* \* \*